United States Patent

[11] 3,613,009

[72] Inventor Walter Meyer
McHenry, Ill.
[21] Appl. No. 806,142
[22] Filed Mar. 11, 1969
[45] Patented Oct. 12, 1971
[73] Assignee Oak Electro/Netics Corp.

[54] TUNER WITH SEPARABLE PASSIVE CIRCUIT ASSEMBLY AND ACTIVE CIRCUIT MODULE
4 Claims, 7 Drawing Figs.

[52] U.S. Cl. .......... 325/356, 317/101, 334/50
[51] Int. Cl. .......... H04b 1/08, H03j 5/00
[50] Field of Search .......... 334/50, 51; 325/352, 355, 356

[56] References Cited

UNITED STATES PATENTS

| | | | |
|---|---|---|---|
| 2,637,763 | 5/1953 | Palmer .......... | 325/355 |
| 2,718,623 | 9/1955 | Yoder et al. .......... | 317/101 C |
| 3,069,638 | 12/1962 | Lindeman et al. .......... | 334/51 |

*Primary Examiner*—Robert L. Griffin
*Assistant Examiner*—James A. Brodsky
*Attorney*—Hofgren, Wegner, Allen, Stellman & McCord

ABSTRACT: A VHF television tuner having a passive tuning circuit assembly and active circuits in a single, plug-in module. The tuning circuits are mounted on switch sections carried on a frame and provided with female clips which receive connector pins on the module. Circuits in the module are covered by a case and the connector pins mounted on the base of the module extend on one side thereof for connection with the female clips and on the other side through the case for connection with other circuits. The connector pins provide both electrical connection and mechanical stability for the circuit module.

PATENTED OCT 12 1971 3,613,009

SHEET 1 OF 2

INVENTOR
Walter Meyer
BY Hofgren, Wegner, Allen, Stellman & McCord
ATTORNEYS

TUNER WITH SEPARABLE PASSIVE CIRCUIT ASSEMBLY AND ACTIVE CIRCUIT MODULE

This invention is concerned with a tuner and more particularly with a VHF television tuner.

A common form of VHF television tuner has a frame with the amplifier, oscillator and mixer elements mounted on top and the circuitry, including tuned circuits for frequency selection, mounted below. The amplifier, oscillator and mixer elements may be tubes or semiconductors and are generally removably mounted in sockets on the frame. The tuned circuits provide for switching between channels. Two forms are in general use. In one, inductors are mounted on rotary switch sections and the frequency selection is made by the setting of the rotary switch. In the other, the circuits are carried by a rotatable turret which positions the selected tuning elements for connection in the circuit.

The tubes or semiconductor active elements are sometimes replaced, often requiring realignment of the tuned circuits. The elements of the active circuitry (as distinguished from the passive frequency selecting tuned circuits) are relatively inaccessible and difficult to replace if they should fail. This is particularly true in a switch-type tuner using wound inductor elements of the character illustrated in Selbmann et at. U.S. Pat. No. 2,835,818, as it must be done without disturbing the physical configuration of the inductors.

In accordance with the invention, only the passive tuning circuits are mounted on the frame of the tuner and the active circuit elements, i.e., the amplifier, oscillator and mixer devices and their associated circuitry, are provided in a single circuit module separably connected with the tuned circuits, as by a plug-in connection. This permits independent access to both portions of the tuner circuitry and, in the event of a failure in the active circuit portion, for example, the circuit module may be replaced without disturbing the passive tuning circuits.

One feature of the invention is the provision of a tuner including a passive frequency selecting circuit assembly with adjustable tuned circuits, an active circuit module connectable with the circuit assembly and separable connector means with cooperating contact portions for connecting the passive and active circuits.

Another feature is that the passive frequency selecting circuit includes a frame with a plurality of rotary switch sections mounted thereon, having tuned circuit elements controlled by the switch sections and the connector contact portions for the passive tuned circuit assembly are on the switch sections. More particularly, the stators of the rotary switch sections have spring clips thereon which receive male contact pins on the active circuit module, and the contact clips have opposed spring fingers which are elongated at right angles to the plane of flexure, so that appropriate contact is made regardless of variations in spacing between the switch sections or the contact pins.

A further feature is the provision of a plug-in circuit module having a supporting element of insulating material with a circuit thereon, a case for the circuit and connector pins extending through the supporting element, connected with the circuit and having end portions which extend outwardly for connection with the circuit.

Yet another feature is that the end portions of the pins may extend outwardly through the case and form a feedthrough capacitor therewith.

And a further feature is that end portions of the pins extend outwardly from the exposed surface of the supporting element for plug-in connection of the module.

Further features and advantages will readily be apparent from the following specification and from the drawings, in which.

The invention as disclosed herein is particularly adapted for utilization in a switch type VHF television tuner, of the character illustrated in Selbmann et al. U.S. Pat. No. 2,835,818. Certain features are also usable in television turret tuners and in tuners for other types of equipment. The particular circuit module illustrated utilizes thick film techniques. Other forms of integrated and miniaturized circuits might be used.

Figures 1, 2, 3:
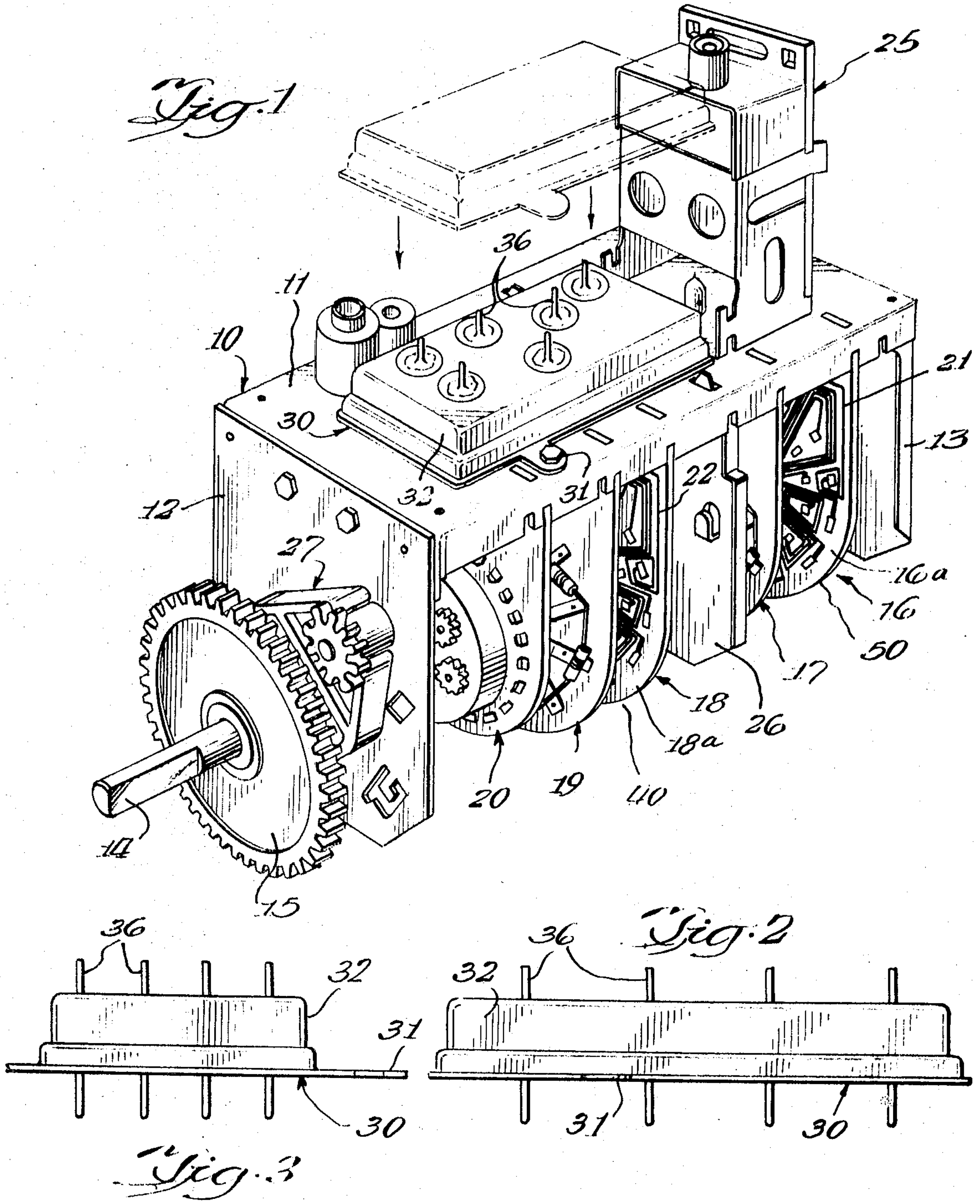
FIG. 1 is a perspective view of a tuner embodying the invention, showing a circuit module separated from the tuner in broken lines.
FIG. 2 is a side elevation of the plug-in module.
FIG. 3 is an end elevation of the plug-in module.

Referring now to FIG. 1 of the drawings, the tuner has a frame 10 including a panel 11 with depending end plates 12 and 13. A channel selector shaft 14 extends through the tuner and provides for tuning the circuits to the desired channel, as will appear. A fine tuning drive gear 15 is rotatably mounted on selector shaft 14.

Switch sections 16, 17, 18, 19 and 20 are mounted on and extend downwardly from panel 11. Each switch section includes a stator, as **16*a* and 18*a*, and a rotor (not shown). The frequency selective circuit elements are mounted on the switch stators, as, for example, the printed inductive elements 21 and 22 illustrated on stators 16*a* and 18*a*, and shown more particularly in copending Meyer application Ser. No. 798,923 filed Feb. 13, 1969, and assigned to the assignee of this invention. The tuner could, of course, use discrete inductor elements as shown in Gelzer, U.S. Pat. No. 2,954,469, for example, The antenna input circuitry is housed in an enclosure 25 and the circuits on switch sections 16 and 17 tune the input circuit of the tuner. A shield 26 separates the input circuitry from the rest of the receiver. The tuned circuits of switch sections 18 and 19 tune the output of the radio frequency amplifier and the input of the mixer and provide coupling between these two stages. Switch section 20 tunes the oscillator; and the particular construction illustrated is that of Ma, U.S. Pat. No. 3,210,485. The fine tuning mechanism 27 is described in detail in Ma, U.S. Pat. No. 3,244,012. The active circuit module 30 is mounted on top of the chassis panel 11 and is secured thereto as by a screw 31 through and ear on the case 32** of the module.

Figure 4:
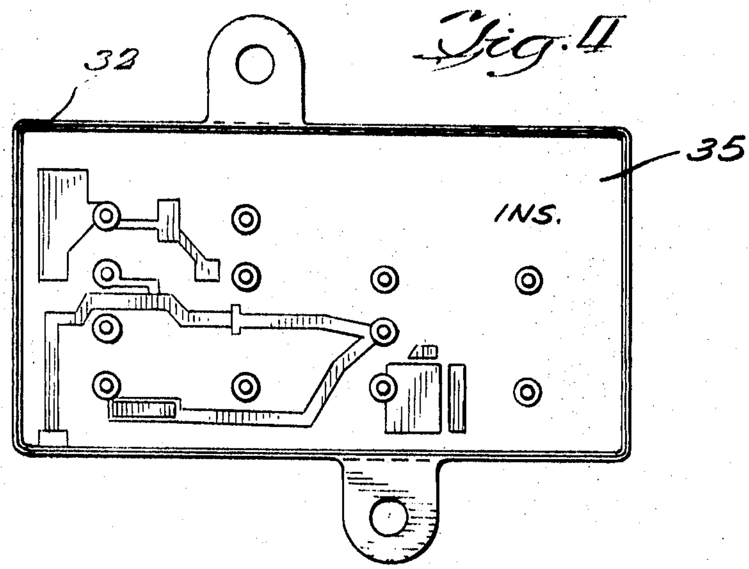
FIG. 4 is a bottom plan view of the plug-in module.

Referring now to FIGS. 2 through 6, the active circuit module is illustrated as including a circuit support element or substrate 35, of insulating material as a ceramic. The major portion of the circuitry, including the active semiconductor circuit elements, most of the resistors, capacitors and wiring are located on the upper surface of substrate 35 and are not shown in detail. The particular physical arrangement and the specific circuit do not form a part of the invention. A few conductors and circuit components are located on the under surface of substrate 35, as illustrated in FIG. 4.

The active circuit module 30 is provided with connector pins 36 which form the male portion of connector means between the active and passive circuits. Female contacts 37 on the rotary switch sections receive the ends of connector pins 36, FIGS. 5 and 6.

Connector pins 36 are arranged in a uniform coordinate pattern on substrate 35 in rows both transversely and longitudinally of the module. The spacing between the transverse rows corresponds with the spacing between the rotary switch sections of the passive circuit assembly.

The female connectors are suitably mounted on the switch sections, as by soldering. Each female contact has a pair of opposed wiper surfaces 38 at the ends of resilient arms 39. It will be noted in FIG. 6 that the longitudinal dimension of the wiper surfaces 38 of the female contacts, at right angles to the plane of flexure, is substantially greater than the diameter of connector pins 36. This accommodates variations in the relative spacing of the cooperating contacts as might occur from variations in the mounting of the switch sections, or from a bent connector pin.

Figures 5, 6, 7:
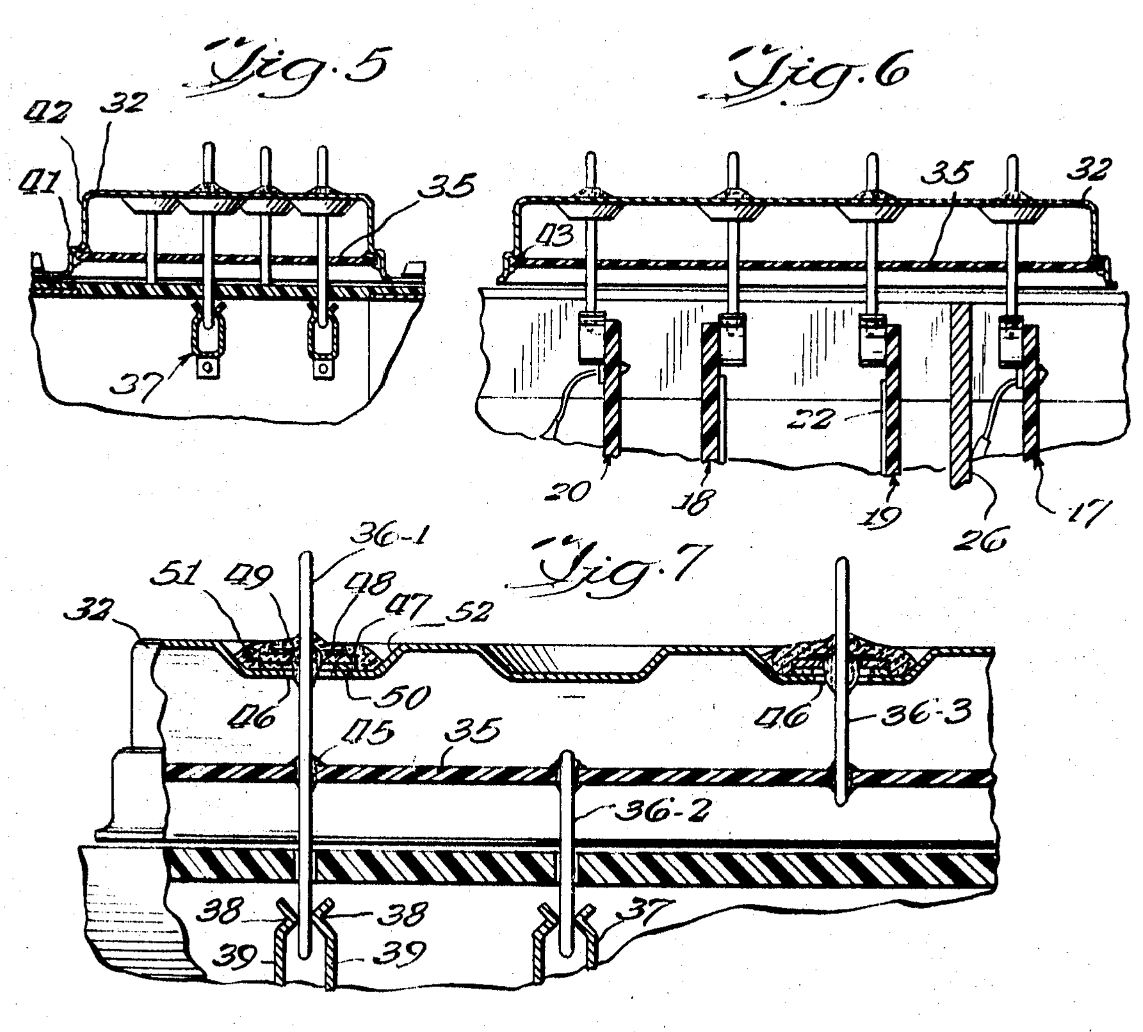
FIG. 5 is a fragmentary transverse section of the module connected with the tuning circuit assembly.
FIG. 6 is a fragmentary longitudinal section of the module connected with the tuning circuit assembly.
FIG. 7 is an enlarged transverse section of the module connected with the tuning circuit assembly, illustrating various connector pin configurations.

As best seen in FIGS. 5 and 6, case 32 is generally rectangular and cup-shaped in cross section. Substrate 35 is seated against a shoulder 41 in the wall 42 of the case. The case is preferably of a conductive material and is electrically grounded to the tuner chassis panel 11. Substrate 35 is provided with a common conductive surface (not shown) around its periphery and electrically connected with the case by conductive cement 43 or by solder.

Turning now to FIG. 7, different configurations of connector pins are shown. Connector pin 36–1 extends in both directions from substrate 35, pin 36–2 extends downwardly for connection with female contact 37 on a switch section of the passive circuit assembly and connector pin 36–3 extends upwardly from the substrate through the case. Each of the connector pins is mounted in an opening in substrate 35 and secured therein both mechanically and electrically by solder, as at 45.

Connector pins 36–1 and 36–3 extend through openings 46 in the module case 32, for connection with other circuits, as the source of operating potential, automatic gain control and the like. It is desirable to decouple the circuits of the module electrically where circuits pass through the case so that signal information is not transferred in either direction. Accordingly, feedthrough capacitors are associated with connector pins 36–1 and 36–3. The structure is generally the same although the capacitance value of the capacitors may differ. With reference to connector pin 36–1, a disc capacitor 47 surrounds the connector pin and has a conductive area 48 on its upper surface, connected with the pin by solder 49. A conductive area 50 on the undersurface of the disc forms the other plate of the capacitor and is soldered with case 32. The entire capacitor assembly is covered with an epoxy adhesive 51. The feedthrough capacitor assembly is preferably formed within a cupped depression 52 in the surface of the case, to aid in the assembly of the elements, to contain the adhesive 51 and to protect the capacitor from damage.

Thick film production technology permits the establishment of tolerances such that modules can be interchanged without affecting the frequency or band-pass characteristics of the tuned circuits. Thus, in the unlikely event of a failure in the active circuit, a service man need merely substitute a new circuit module without the necessity for realigning the tuner circuitry.

I claim:

1. A variable frequency tuner, comprising:
   a frame;
   a plurality of rotary switch sections each having a stator, mounted in aligned parallel relation on said frame, and each having a rotor;
   a passive frequency selecting circuit assembly having adjustable tuned circuits and including only passive circuit elements carried on said frame, said rotors controlling the selection of said tuned circuit elements;
   an active circuit module connectable with said passive circuit assembly and including all active circuit elements of said tuner; and
   separable connector means having a single set of female contact portions mounted along one edge of each stator, the edges with the contact portions being aligned and cooperating complementary male contact portions extending from said active circuit module for connecting the passive and active circuit elements.

2. The tuner of claim 1 in which said female contacts are clips each having a pair of opposed spring fingers, said active circuit module having male contact pins received between said spring fingers.

3. The tuner of claim 2 wherein said spring fingers are elongated at right angles to the plane of flexure to accommodate variations in relative spacing of the complementary contact pins.

4. The tuner of claim 1 wherein said frame includes a panel with the switch sections extending therefrom and the active circuit module is received on the panel on the opposite side from said switch sections.